United States Patent
Song et al.

(10) Patent No.: US 7,852,168 B1
(45) Date of Patent: Dec. 14, 2010

(54) POWER-EFFICIENT BIASING CIRCUIT

(75) Inventors: Yonghua Song, Cupertino, CA (US);
Chun Geik Tan, Singapore (SG); Randy Tsang, Foster City, CA (US); Chunwei Chang, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 52 days.

(21) Appl. No.: 11/840,745

(22) Filed: Aug. 17, 2007

Related U.S. Application Data

(60) Provisional application No. 60/822,694, filed on Aug. 17, 2006.

(51) Int. Cl.
*H03L 5/02* (2006.01)
*H03L 7/099* (2006.01)
(52) U.S. Cl. .................................. 331/185; 331/177 R
(58) Field of Classification Search ............. 331/177 R, 331/185, 186; 327/530, 544, 547, 548
See application file for complete search history.

(56) References Cited

U.S. PATENT DOCUMENTS

| | | | |
|---|---|---|---|
| 6,590,441 B2* | 7/2003 | Papathanasiou | 327/530 |
| 6,781,450 B1* | 8/2004 | Mercer et al. | 330/9 |
| 6,788,161 B2* | 9/2004 | Vilander | 331/185 |
| 7,443,260 B2* | 10/2008 | Saether | 331/185 |

* cited by examiner

*Primary Examiner*—Robert Pascal
*Assistant Examiner*—Ryan Johnson

(57) ABSTRACT

Energy-efficient timing circuits are described. Such circuits may include a biasing circuit configured to provide a control bias current to a voltage-controlled oscillator (VCO). The biasing circuit may repetitively switch between a normal-power operating mode and a reduced-power operating mode. During the normal-power operating mode, the biasing circuit may generate a control voltage representative of a desired control bias current for the VCO. By then storing the control voltage using a device, such as a capacitor, much of the biasing circuit may be turned off during the reduced-power operating mode.

64 Claims, 9 Drawing Sheets

POWER-EFFICIENT BIASING CIRCUIT

INCORPORATION BY REFERENCE

This application claims priority under 35 U.S.C. §119(e) from U.S. Provisional Application Ser. No. 60/822,694 entitled "Bias Switching Based VCO", filed on Aug. 17, 2006, herein incorporated by reference herein in it entirety.

BACKGROUND

Voltage controlled oscillators (VCOs) are ubiquitous circuits used in a large variety of electronic devices. For example, the VCO is an essential building block of phase-lock loops (PLLs), which may be found in cellular telephones, data storage devices, fiber optic communication systems and satellite radio receivers.

While VCOs are not generally thought to be "power hungry" pieces of circuitry, the proliferation of hand-held devices, such as cellular phones, has put pressure on the designers of electronic equipment to produce increasingly energy-efficient VCOs. Unfortunately, traditional methods of reducing power consumption in VCOs tend to cause such VCOs to exhibit increased noise, which in turn tends to lower their performance. Accordingly, it should be appreciated that even modest energy savings may degrade a VCO's performance to the detriment of the system incorporating the VCO.

SUMMARY OF THE DISCLOSURE

In various embodiments energy-efficient biasing techniques are described. Such biasing techniques may include a biasing circuit configured to provide a control bias current to a voltage-controlled oscillator (VCO). The biasing circuit may repetitively switch between a normal-power operating mode and a reduced-power operating mode. During the normal-power operating mode, the biasing circuit may generate a control voltage representative of a desired control bias current for the VCO. By storing the control voltage using a device, such as a capacitor, much of the biasing circuit may be turned off during the reduced-power operating mode.

BRIEF DESCRIPTION OF THE DRAWINGS

The power-conserving devices and methods are described with reference to the following figures, wherein like numerals reference like elements, and wherein.

DETAILED DESCRIPTION OF EMBODIMENTS

In the following descriptions, many of the exemplary circuits are shown to include n-channel and p-channel metal-oxide-semiconductor field-effect transistors (MOSFETs) in a variety of configurations. While MOSFET devices are used by example, the disclosed circuits may, at least in part, be implemented using any number of other transistor types, such as J-FETs, IGBTs, bipolar transistors and so on.

Still further, while the terms "drain" and "source" are used for ease of explanation and to adhere to traditional engineering usage, it should be recognized that a drain and a source of a FET transistor may be considered interchangeable. For the following descriptions, a source and drain may be merely thought of as a first end and a second end of a semiconductor channel (or a first and second power terminal) unless otherwise stated or apparent to one of ordinary skill in the art.

Figure 1:
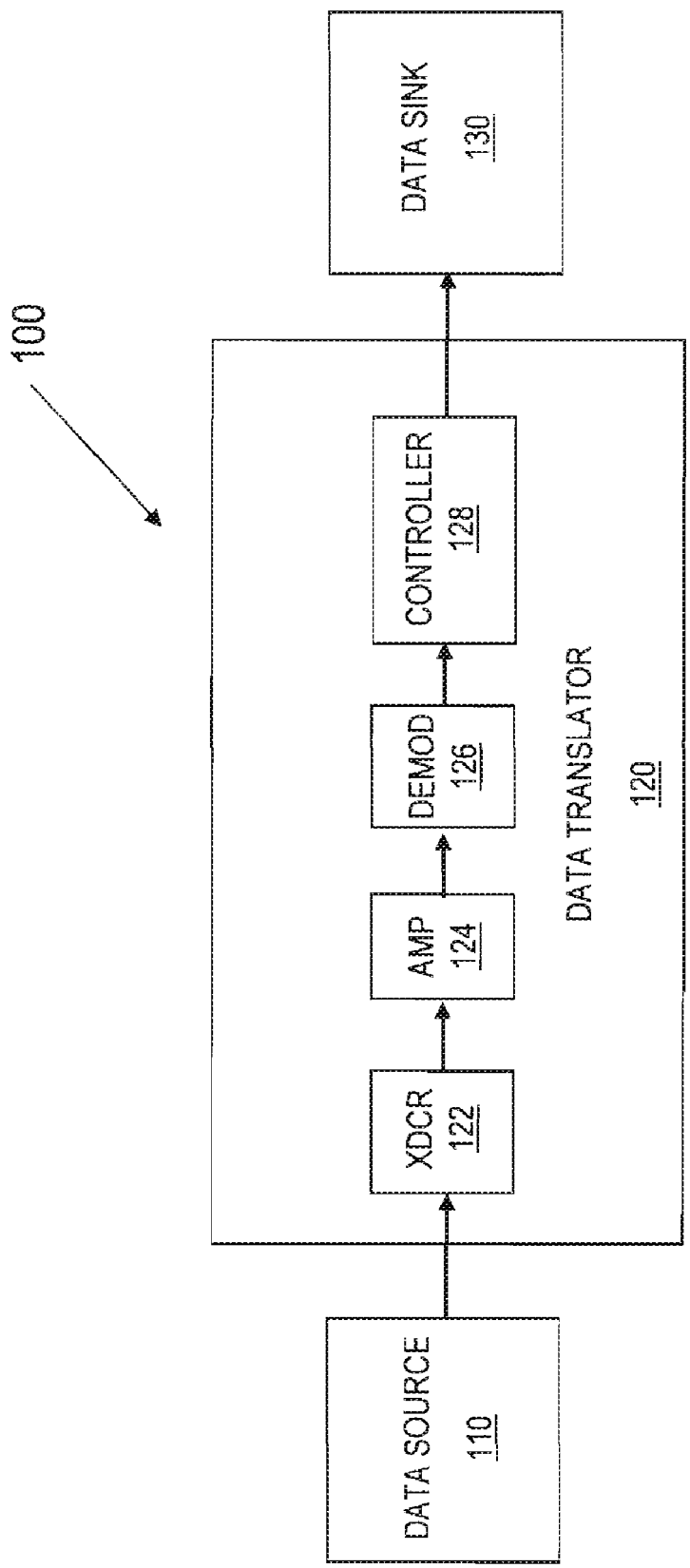
FIG. 1 is a block diagram of an exemplary data manipulation system.

FIG. 1 is a block diagram of an exemplary data manipulation system 100. As shown in FIG. 1, data manipulation system 100 includes a data source 110, a data translator 120 and a data sink 130. As also shown in FIG. 1, data translator 120 includes a transducer 122, an amplifier 124, a demodulator 126 and a controller 128.

In operation, a data signal may be provided by data source 110 to transducer 122. Transducer 122, in turn, may change the data signal from a first form, e.g., a magnetic field or modulated light signal, to an output signal having an electrical form, which may then be fed to amplifier 124. Amplifier 124 may receive the electrical signal produced by transducer 122, amplify the electrical signal, and output the resultant amplified electrical signal to demodulator 126.

Upon receiving the amplified electrical signal, demodulator 126 may perform any number of processes to convert the amplified signal from analog form to a stream of digital data, which then may be forwarded to controller 128. As controller 128 receives the stream of digital data from demodulator 126, controller 128 may forward the digital data to the data sink 130.

In various embodiments, data source 110 may be any number of known or later developed data communication systems, data storage systems or any type of device that may benefit from low power consumption. For example, data source 110 may be a fiber-optic communication system, a wireless transmitter, an electrical transmission system (e.g., an Ethernet LAN), an optical storage medium, a magnetic hard disk drive, an electronic memory and so on. Similarly, data sink 130 may be any number of known or later developed data communications or storage systems capable of receiving signals produced by data translator 120.

Depending on the nature of data source 110, transducer 122 may be any number of known or later developed transducer systems, such as a magnetic head reader for a hard disk drive, an optical-to-electrical transducer, a transimpedance amplifier, a voltage buffer, an antenna for use with a wireless communication system and the like. Note that the translator 120 may reside in any number of non-portable or portable devices, such as a cellular telephone, a personal digital assistant, a portable computer, a satellite, a media reader and a communication unit disposed in a movable platform.

Figure 2:
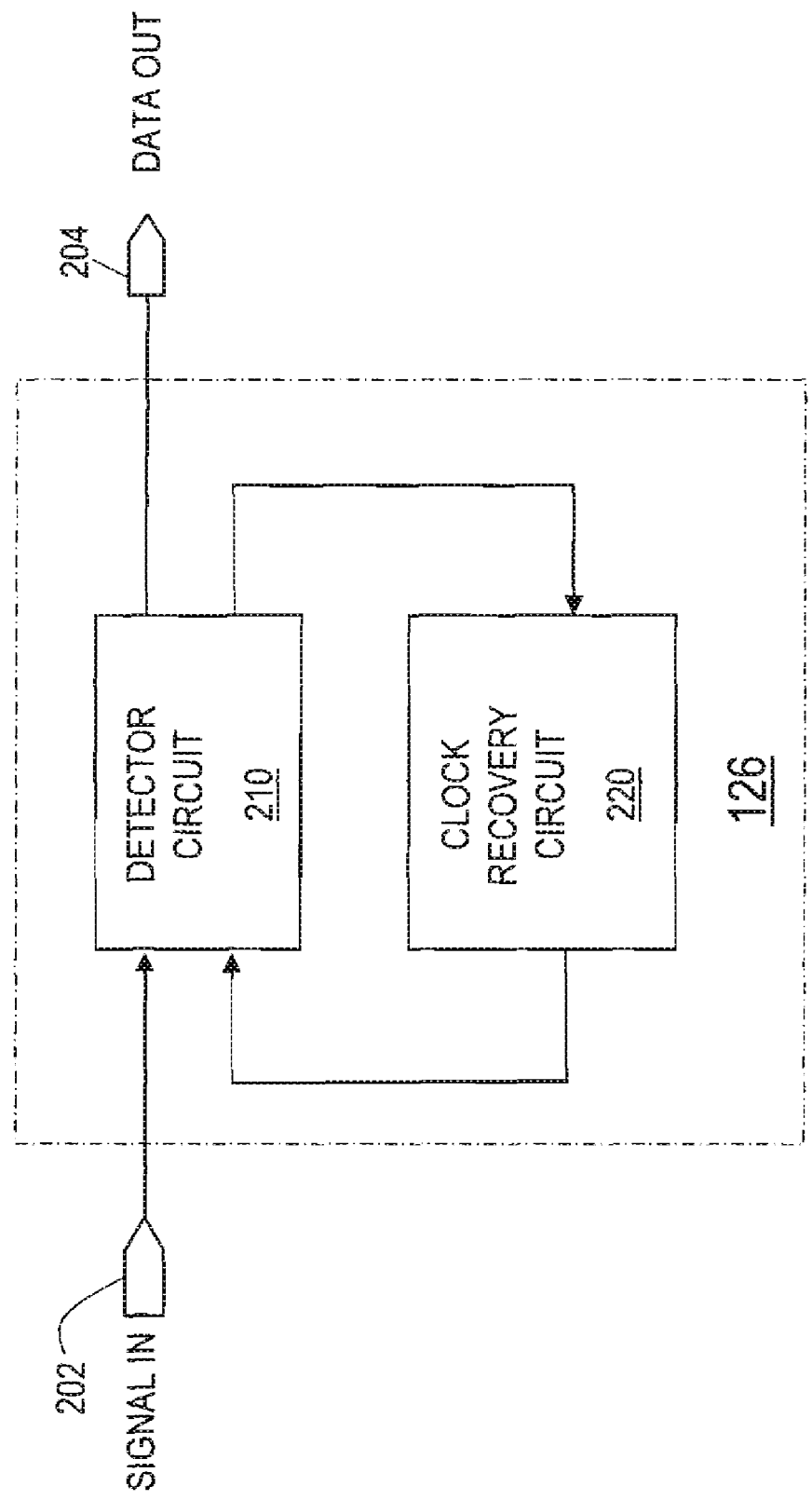
FIG. 2 is a block diagram of an exemplary demodulator that may be used in the data manipulation system of FIG. 1.
Figure 3:
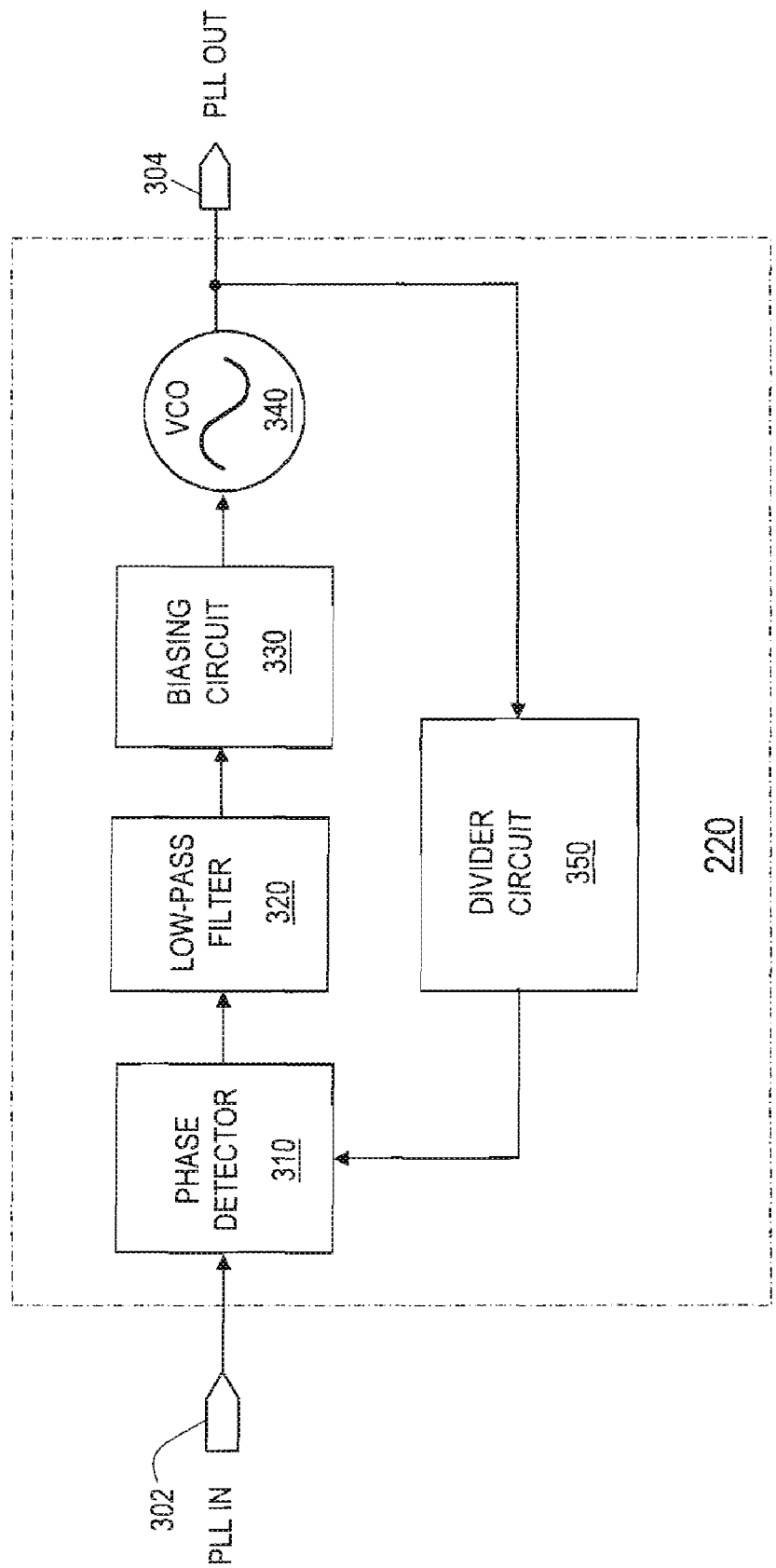
FIG. 3 is a block diagram of a portion of the clock recovery circuit of FIG. 2.

FIG. 2 depicts a portion of exemplary demodulator 126 of FIG. 1. As shown in FIG. 2, demodulator 126 includes a detector circuit 210 and a clock-recovery circuit 220. In operation, detector circuit 210 may receive a communications signal via input node 202, and perform a number of data extraction processes useful to produce a stream of symbols (data) at node 204 while performing a number of preconditioning processes to provide a second signal to clock recovery circuit 220. Clock recovery circuit 220 may derive a synchronized clock signal using the preconditioned signal, and feed the synchronized clock signal back to the detector circuit 210 to allow detector circuit 210 to correctly extract symbols. While FIG. 2 depicts a basic demodulation scheme, it should be appreciated that any number of known or later developed systems containing detection and/or clock recovery functions may otherwise be used as may be found necessary or otherwise advantageous:

FIG. 3 is a block diagram of clock recovery circuit 220 of FIG. 2, which for the present example takes the form of a phase-lock loop (PLL). As shown in FIG. 3, clock recovery circuit 220 includes a phase detector 310, a low-pass filter 320, a biasing circuit 330, a voltage-controlled oscillator (VCO) 340 and a divider circuit 350.

In operation, phase detector 310 may receive a signal containing an embedded clock (PLL IN) via node 302, as well as a feedback signal from divider circuit 350. Using the received signals, phase detector 310 may produce an output signal representative of a phase difference of the two received signals, and provide this output signal to low-pass filter 320. Low-pass filter 320 may filter the phase detector's output signal to attenuate embedded high frequency components, and provide a filtered output signal to biasing circuit 330.

Biasing circuit 330 may receive the filtered output signal, and produce a control bias current to the VCO 340 using the filtered output signal. In turn, VCO 340 may change its rate of oscillation to produce a controlled clock signal (PLL OUT) to output node 304 and to divider circuit 350. Divider circuit 350 may divide the VCO's output signal by some predetermined integer value, and deliver this quotient back to phase detector 310.

Figure 4:
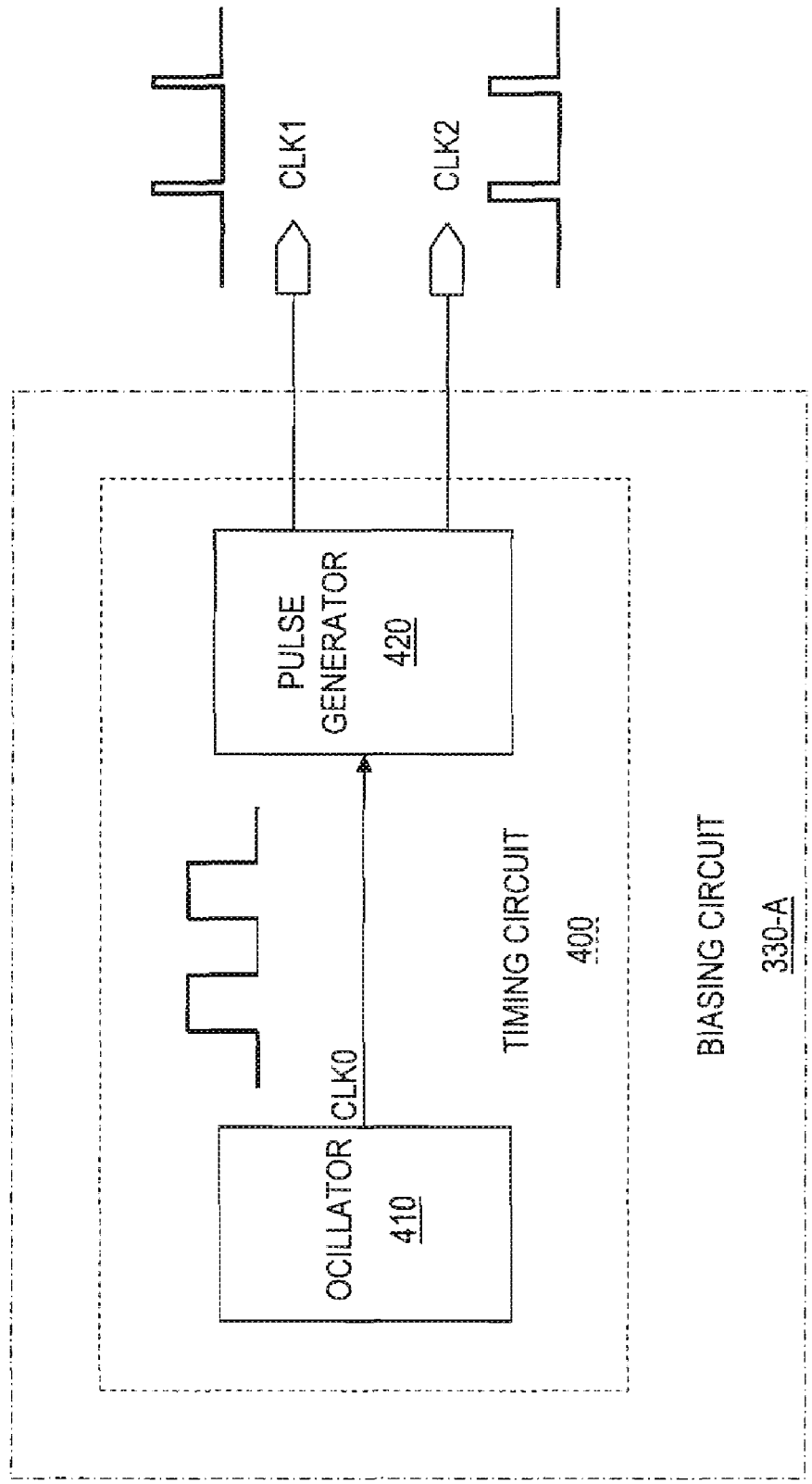
FIG. 4 is a block diagram of a first portion of the exemplary biasing circuit of FIG. 3.

Continuing to FIG. 4, a block diagram of a first portion 330-A of biasing circuit 330 of FIG. 3 is depicted. As shown in FIG. 4, first portion 330-A includes a timing circuit 400, which in turn includes an oscillator 410 and a pulse generator 420. In operation, oscillator 410 may provide a primary clock signal CLK to pulse generator 420. Pulse generator 420 may use primary clock signal CLK to produce a first control clock pulse signal CLK1 and a second control clock pulse signal CLK2, both of which may be provided to other portions of biasing circuit 330 as will be discussed below.

It should be appreciated that the control clock pulse signals CLK1 and CLK2 may inadvertently introduce noise into clock recovery circuit 220 shown in FIG. 2. However, given that PLLs tend to have an embedded high-pass filter, it may be advantageous to set the frequency of primary clock signal CLK to a sufficiently low frequency such that any noise inadvertently introduced by control pulse clock signals CLK1 and CLK2 may be effectively removed. For example, by setting primary clock signal CLK to a frequency less than one-thousandth of the clock frequency at node 302, it may be possible to attenuate any noise introduced by biasing circuit 330 by 40 db or more.

Figure 5:
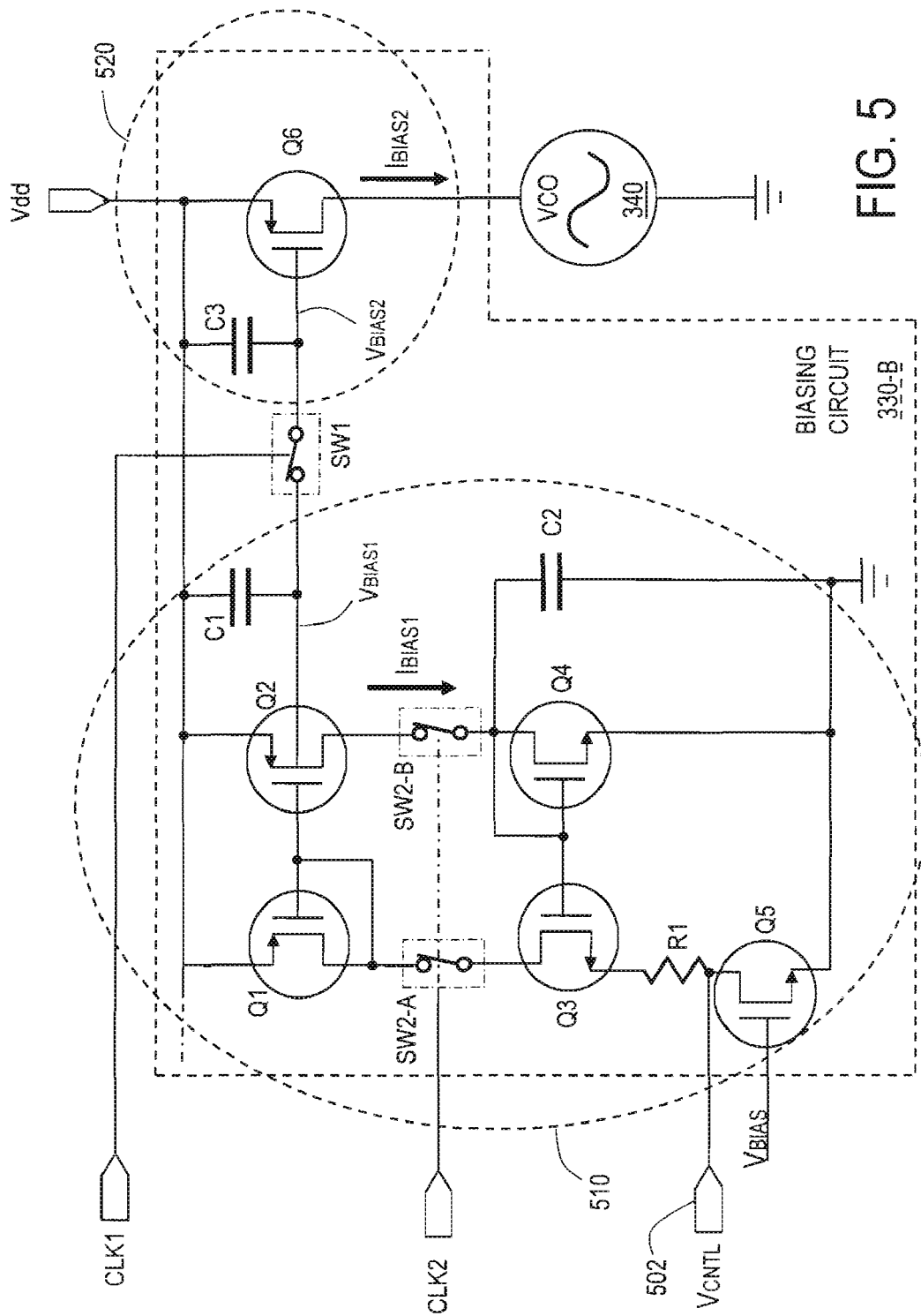
FIG. 5 is a schematic diagram of a second portion of the exemplary biasing circuit of FIG. 3.

Continuing to FIG. 5, a schematic diagram of a second portion 330-B of biasing circuit 330 of FIG. 3 is depicted in context with VCO 340. As shown in FIG. 5, second portion 330-B of biasing circuit 300 includes a bias current controlling circuit 510 and a bias current supplying circuit 520 coupled together via an isolation switch SW1, which may be controlled by first control pulse clock signal CLK1 input at a control terminal of switch SW1. As further shown in FIG. 5, bias current controlling circuit 510 includes a first pair of (p-channel) MOSFETs Q1 and Q2 having gates coupled together and to (optional) capacitor C1, a second pair of (n-channel) MOSFETs Q3 and Q4 having a gates coupled together and to (optional) capacitor C2, a pair of bias current control switches SW2-A and SW2-B placed between MOSFET pairs Q1/Q2 and Q3/Q4, and a resistor R1 and MOSFET Q5 placed in series with the source of MOSFET Q3.

As is also shown in FIG. 5, bias current supply circuit 520 includes a (p-channel) MOSFET Q6 with its source connected to VCO 340 and its gate connected to capacitor C3 and isolation switch SW1. MOSFET Q5 may be gate biased by a feedback voltage $V_{BIAS}$ produced by other circuitry (not shown in FIG. 5).

In operation, assuming that bias current control switches SW2-A and SW2-B are closed under control of second control pulse clock signal CLK2 input at respective control terminals of switches SW2-A and SW2-B, current controlling circuit 510 may be set to cause a bias current $I_{BIAS1}$ to flow through each of bias current control switches SW2-A and SW2-B as a function of a control signal $V_{CNTL}$ provided at node 502. Note that control signal $V_{CNTL}$ may be derived from any number of devices, such as phase detector 310 and/or low-pass filter 320 of FIG. 3. Also note that control signal $V_{CNTL}$ and resultant bias current $I_{BIAS1}$ may be representative of a signal usable to cause VCO 340 to oscillate at a desired frequency.

During a first time period when bias current $I_{BIAS1}$ is flowing through both bias current control switches SW2-A and SW2-B (i.e., when second control pulse clock signal CLK2 is in an active state), bias current controlling circuit 510 may consume a current that is set for a desired operation of VCO 430, and bias current controlling circuit 510 may be considered to be in a "normal operating mode" or "normal power operating mode." In contrast, when bias current control switches SW2-A and SW2-B are open, virtually no current/power may be consumed by bias current controlling circuit 510, and bias current controlling circuit 510 may be considered to be in a "reduced power operating mode."

While bias current controlling circuit 510 is in the normal power operating mode, the gate voltage of MOSFETs Q1 and Q2 ($V_{BIAS1}$) may adjust itself to an appropriate level as a function of current level $I_{BIAS1}$. When isolation switch SW1 is closed, the gate voltage of MOSFET Q6 ($V_{BIAS2}$) may be equal to $V_{BIAS1}$. As MOSFET Q6 is configured as a current mirror to MOSFETs Q1 and Q2, the bias current $I_{BIAS2}$ provided to VCO 340 may be a function of $I_{BIAS1}$ such that $I_{BIAS2}=I_{BIAS1} \times K$, where K is a constant.

Given that the gate impedance of MOSFET Q6 is extremely high, when isolation switch SW1 is open, capacitor C3 may hold the appropriate voltage charge at the gate of MOSFET Q6 as long as the other side of capacitor C3 is coupled to ground, power (Vdd) or some other reference node that may not change substantially compared to ground and power. Of course, it should be appreciated that there may be some current leakage such that $V_{BIAS2}$ may drift over time while isolation switch SW1 is open. Further functionality of bias circuit 330 will be discussed below with respect to FIGS. 6 and 7.

Figure 6:
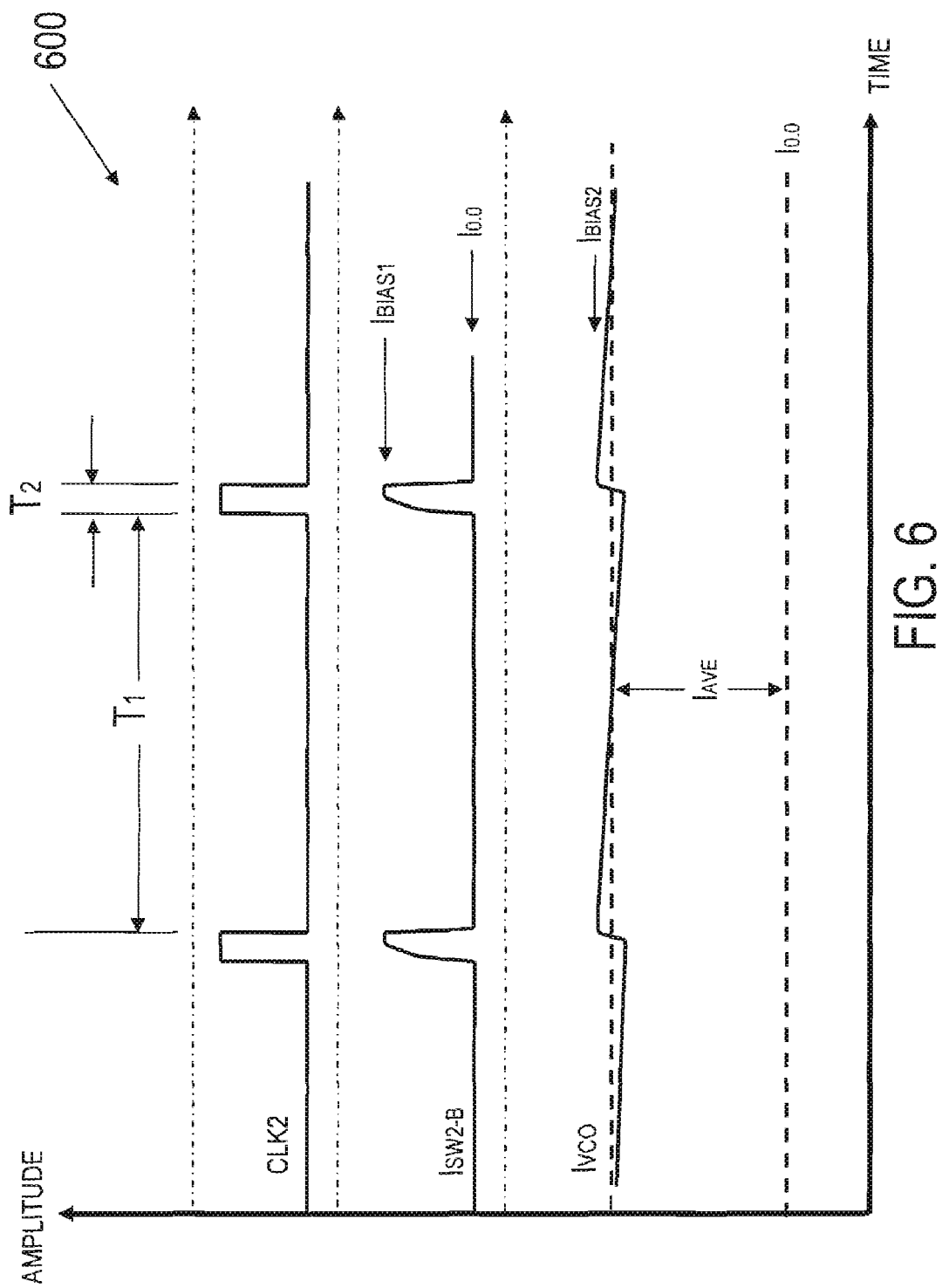
FIG. 6 is a timing diagram depicting high-level functionality of the exemplary biasing circuit of FIG. 3.

FIG. 6 is a timing diagram 600 depicting the high-level functionality of exemplary biasing circuit 330 of FIGS. 4 and 5. As shown in FIG. 6, second control pulse clock signal CLK2 is shown at the top of timing diagram 600 as being cyclic and having a logic low (inactive) time period T1, where control switches SW2-A and SW2-B are open, and a logic high (active) time period T2, where control switches SW2-A and SW2-B are closed.

Just below second control pulse clock signal CLK2 is an exemplary trace of the current flowing through control switch SW2-B ($I_{SW2-B}$) generated as a function of second control pulse clock signal CLK2. As may be seen in FIG. 6, current $I_{SW2-B}$ may vary between 0.0 mA (control switches SW2-A and SW2-B open) and $I_{SW2-B}=I_{BIAS1}$ (control switches SW2-A and SW2-B closed). Given that the amount of power consumed by bias current controlling circuit 510 may be proportional to the square of the current consumed, the advantage of making T1<<T2, and of making time period T2 as short as possible, may be recognized to those skilled in the relevant arts. Accordingly, it should be appreciated that the duty cycle of second control pulse clock signal CLK2 (as defined as T2/(T1+T2)) or the ratio of time periods T2/T1 may be practically any number, e.g., 50%, 25%, 10%, 1% 0.1%, and so on, with increasing power savings to be had as these numbers decrease.

Below control current signal $I_{SW2-B}$ is an exemplary trace of the bias current flowing to VCO 340 ($I_{VCO}$)—the form of which assumes that isolation switch SW1 is appropriately enabled only during a portion of time period T2—as will be further discussed below with respect to FIG. 7. As may be seen in FIG. 6, VCO bias current $I_{VCO}$ is shown having a slight ripple about an average current level $I_{AVE}$. Notice that current level $I_{VCO}$ corrects to $I_{BIAS2}$ (=$I_{BIAS1}\times K$) during time period T2 but otherwise trends upward toward power supply voltage Vdd during time period T1 due to leakage across capacitor C3. While the apparent ripple about average current level $I_{AVE}$ may introduce noise into a system incorporating bias circuit 330, such noise may be removed (if necessary) either by using a special filter or by some inherent filtering of the system incorporating the bias circuit 330.

Figure 7:
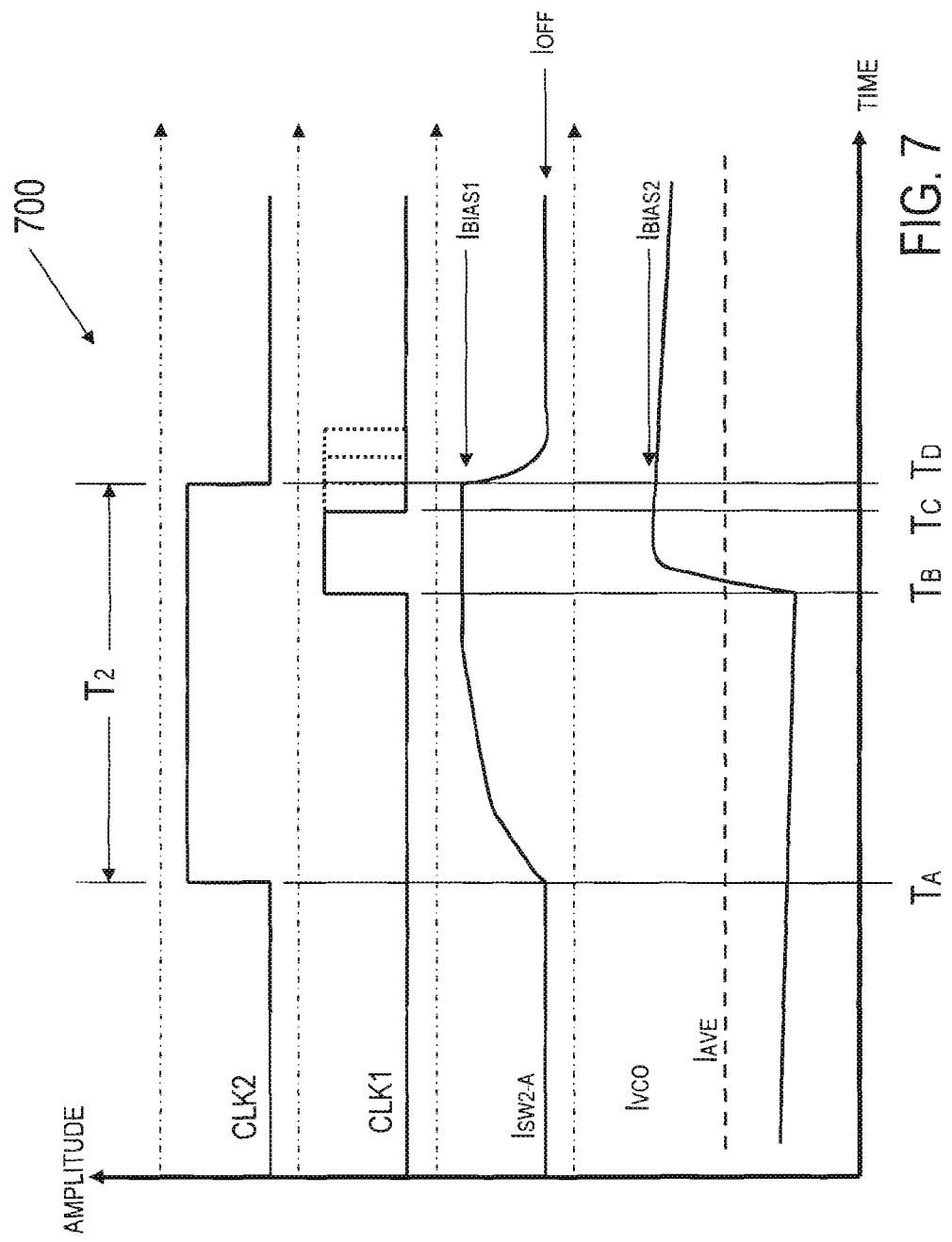
FIG. 7 is a timing diagram depicting detailed functionality of the exemplary biasing circuit of FIG. 3.

FIG. 7 is a timing diagram 700 depicting detailed functionality of exemplary biasing circuit 330 of FIGS. 4 and 5 with special emphasis on (active) time period T2. As shown in FIG. 7, first control pulse clock signal CLK1, which controls isolation switch SW1, is depicted just below second control pulse clock signal CLK2, which controls bias current control switches SW2-A and SW2-B. Note that there is a "setup" time ($T_A-T_B$) before first control pulse clock signal CLK1 goes active, and a "hold" time ($T_C-T_D$) after first control pulse clock signal CLK1 goes inactive.

The setup time ($T_A-T_B$) enables bias current control circuit 510 to both fully energize and stabilize before isolation switch SW1 closes such that bias current supply circuit 520 is under the immediate control of bias current control circuit 510. The hold time ($T_C-T_D$) may provide some buffering such that isolation switch SW1 is open and capacitor C3 is holding an appropriate bias voltage $V_{BIAS2}$ before bias current supply circuit 520 shuts down. Note that in various embodiments hold time ($T_C-T_D$) may not be necessary, and in some embodiments hold time ($T_C-T_D$) may take a negative value, i.e., CLK1 pulse falls before CLK2 pulse. Also consider that the setup time ($T_A-T_B$) may be reduced by the addition of capacitors C1 and C2, which may hold the gate bias voltages for respective MOSFET pairs Q1/Q2 and Q3/Q4 while control switches SW2-A and SW2-B are open and bias current control circuit 510 de-energized.

Figure 8:
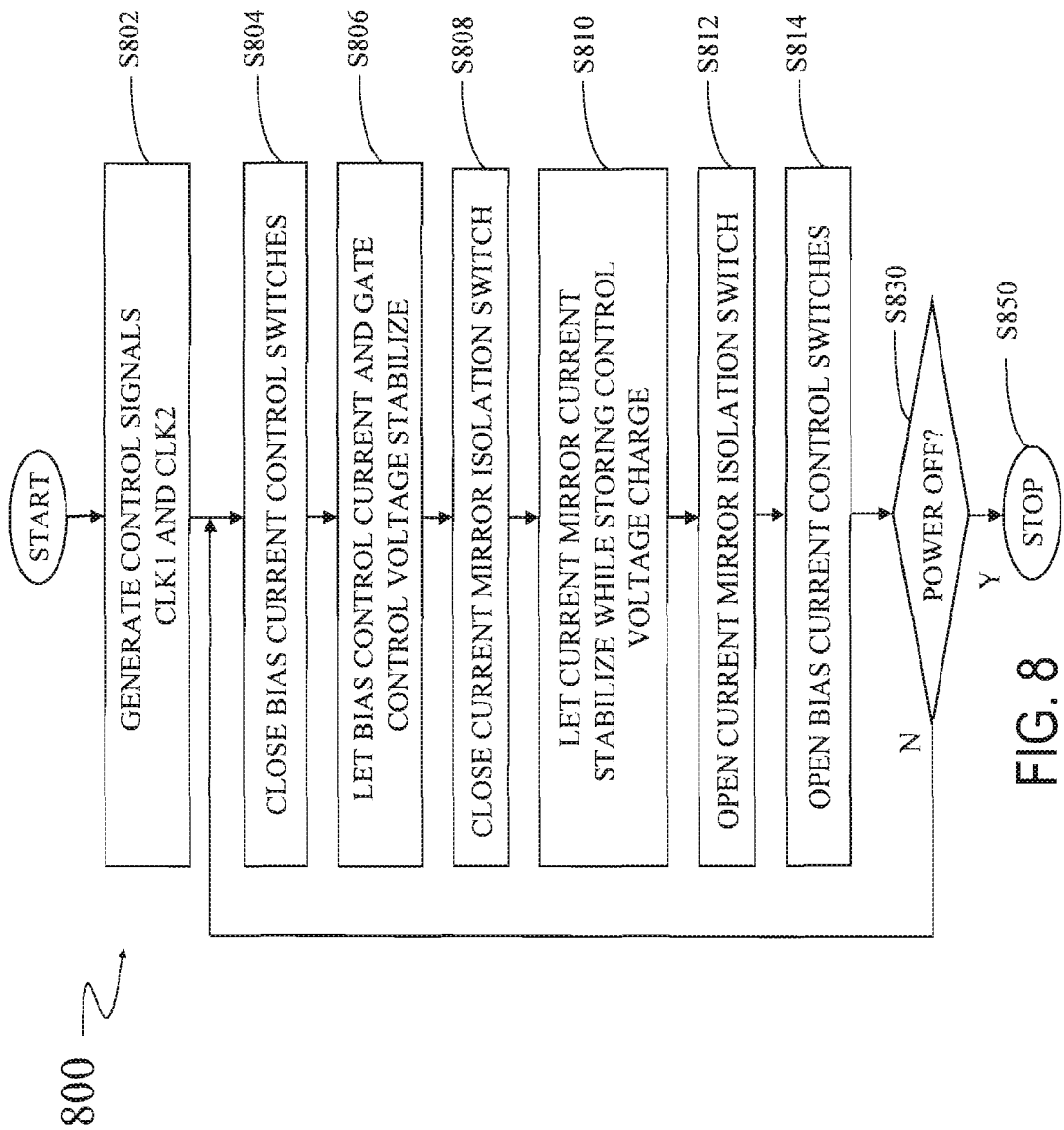
FIG. 8 is a flowchart outlining an exemplary process for operating an energy-efficient VCO biasing circuit.

FIG. 8 is a flowchart outlining an exemplary process for operating a VCO current biasing circuit, such as the biasing circuit 330 described in FIGS. 3-7 above. The process starts in step S802 where two low duty-cycle control pulse clock signals CLK1 and CLK2 are produced. As described above with respect to FIGS. 6 and 7, second control pulse clock signal CLK2 may allow for a setup and hold time about first control pulse clock signal CLK1. Control goes to step S804.

In step S804, a number of bias current control switches are closed under control of control pulse clock signal CLK2, and control goes to step S806. In step S806, a bias control current and respective gate control voltage for a bias current control circuit may adjust to their steady-state points and stabilize, and control goes to step S808. In step S808, an isolation switch leading to a current mirror may be closed such that the current mirror may provide a desired bias current to a VCO under immediate control of the bias current control circuit, and control goes to step S810.

In step S810, the output of the current mirror may be allowed to stabilize while the gate control voltage for a bias current controlling circuit is continually stored by a capacitor or other device, and control goes to step S812. In step S812, the current mirror isolation switch of step S808 may be opened to isolate the bias current control circuit from the current mirror, and control goes to step S814. In step S814, the bias current control switches of step S804 are opened in order to disable the bias current control circuit and thus reduce power consumption, and control goes to step S830.

In step S830, a determination is made as to whether to turn the power of the subject circuitry off. If power is to be turned off, the process goes to step S850 where the process stops; otherwise, the process returns to step S804.

Figure 9:
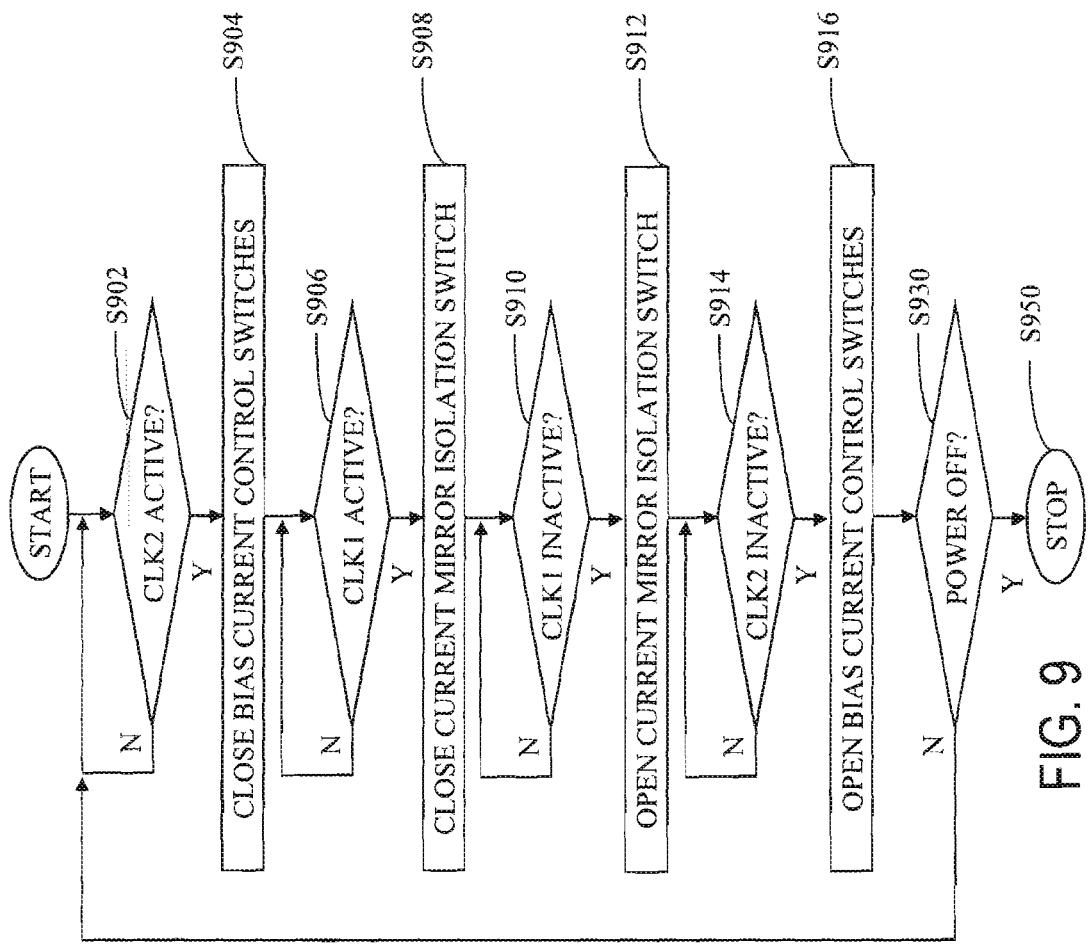
FIG. 9 is another flowchart outlining an exemplary process for operating an energy-efficient VCO biasing circuit.

FIG. 9 is another flowchart outlining an exemplary process for operating an energy-efficient VCO biasing circuit. As with the flowchart of FIG. 8, the present flowchart may use two low duty-cycle control pulse clock signals CLK1 and CLK2, such as those described above with respect to FIGS. 6 and 7. The process starts in step S902 where a determination is made as to whether CLK2 is active. If CLK2 is active, then control goes to step S904; otherwise, control goes back to step S902.

In step S904, a number of bias current control switches may be closed under control of control pulse clock signal CLK2. Additionally, a bias control current and respective gate control voltage for a bias current control circuit may adjust to their steady-state points and stabilize in response to the closing of the bias current control switches, and control goes to step S906. In step S906, a determination is made as to whether CLK1 is active. If CLK1 is active, then control goes to step S908; otherwise, control goes back to step S906.

In step S908, an isolation switch leading to a current mirror may be closed such that the current mirror may provide a desired bias current to a VCO under immediate control of the bias current control circuit. Additionally, the output of the current mirror may be allowed to stabilize while the gate control voltage for a bias current controlling circuit is continually stored by a capacitor or other device, and control goes to step S910.

In step S910, a determination is made as to whether CLK1 is inactive. If CLK1 is inactive, then control goes to step S912; otherwise, control goes back to step S910. In step S912, the isolation switch leading to the current mirror may be opened to isolate the bias current control circuit from the current mirror, and control goes to step S914

In step S914, a determination is made as to whether CLK2 is inactive. If CLK2 is inactive, then control goes to step S916; otherwise, control goes back to step S914. In step S916, the isolation switch leading to the current mirror may be opened to isolate the bias current control circuit from the current mirror, and control goes to step S914. In step 916, the bias current control switches are opened in order to disable the bias current control circuit and thus reduce power consumption, and control goes to step S930.

In step S930, a determination is made as to whether to turn the power of the subject circuitry off. If power is to be turned off, the process goes to step S950 where the process stops; otherwise, the process returns to step S902.

While the disclosed methods and systems have been described in conjunction with exemplary embodiments, these embodiments should be viewed as illustrative, not limiting.

Various modifications, substitutes, or the like are possible within the spirit and scope of the disclosed methods and systems.

What is claimed is:

1. A biasing apparatus that biases an electronic apparatus, comprising:
    a bias control circuit that changes during biasing of the electronic apparatus between a normal power consumption mode and a reduced power consumption mode, the normal power consumption being greater than the reduced power consumption of the bias control circuit;
    a biasing circuit that biases the electronic apparatus based on a bias signal that the bias control circuit sets only when the bias control circuit is in the normal power consumption mode; and
    a first switch circuit coupled between the bias control circuit and the biasing circuit.

2. The biasing apparatus of claim 1, wherein the biasing circuit further includes a first storage device that maintains a first state corresponding to the bias signal, the biasing circuit biasing the electronic apparatus based on the first state of the first storage device when the bias signal is not produced by the bias control circuit.

3. The biasing apparatus of claim 2, wherein the bias signal is a biasing current.

4. The biasing apparatus of claim 2, wherein the first storage device is a capacitor.

5. The biasing apparatus of claim 2, wherein the first switch circuit is configured to both close and open while the bias control circuit is in the normal power consumption mode.

6. The biasing apparatus of claim 2, wherein the first switch circuit closes when the bias control circuit is in the normal power consumption mode, and opens when the bias control circuit is in the reduced power consumption mode.

7. The biasing apparatus of claim 2, wherein the biasing circuit includes a first transistor having a first control terminal and a pair of first power terminals, the first control terminal being coupled to the first switch circuit and the first storage device, and the pair of first power terminals being interposed between a power source and the electronic apparatus.

8. The biasing apparatus of claim 7, wherein the first transistor is a FET transistor.

9. The biasing apparatus of claim 2, further comprising a first clock that controls opening and closing of the first switch circuit, the first clock having a first active time period, a first inactive time period, and a first active duty cycle.

10. The biasing apparatus of claim 9, further comprising:
    a first bias control circuit portion of the bias control circuit, the first bias control circuit portion generating the bias signal;
    a second bias control circuit portion of the bias control circuit; and
    a second switch circuit that connects the first bias control circuit portion with the second bias circuit control portion during the normal power consumption mode, and disconnects the first bias control circuit portion from the second bias control circuit portion during the reduced power consumption mode.

11. The biasing apparatus of claim 10, further comprising:
    a first switch of the second switch circuit; and
    a second switch of the second switch circuit, the bias control circuit being in the reduced power consumption mode when the first and second switches are opened, and the bias control circuit being in the normal power consumption mode when the first and second switches are closed.

12. The biasing apparatus of claim 11, further comprising a second storage device connected to the first bias control circuit portion and configured to maintain the bias signal when the bias control circuit is in the reduced power consumption mode.

13. The biasing apparatus of claim 12, further comprising a second clock that controls the second switch circuit, the second clock having a second active time period, a second inactive time period and a second active duty cycle, the second active duty cycle being equal to or greater than the first active duty cycle.

14. The biasing apparatus of claim 13, further comprising a second transistor and a third transistor of the first bias control circuit portion, control terminals of the second and third transistors being connected together, power terminals of the second and third transistors being connected between a power source and the second switch circuit.

15. The biasing apparatus of claim 14, wherein the second and third transistors are FET transistors.

16. The biasing apparatus of claim 15, wherein:
    the second and third transistors are p-channel MOSFET transistors,
    gates of the second and third transistors being set at the bias signal during normal power consumption mode,
    sources of the second and third transistors being connected to the power source, a drain of the second transistor, a gate of the second transistor and a third node being connected together, and
    the source of the third transistor being connected to a fourth node.

17. The biasing apparatus of claim 14, further comprising a fourth transistor and a fifth transistor of the second bias control circuit portion, control terminals of the fourth and fifth transistors being connected together, power terminals of the fourth and fifth transistors being connected between the power source and the second switch circuit.

18. The biasing apparatus of claim 17, wherein:
    the fourth and fifth transistors are n-MOSFET transistors,
    sources of a first transistor and the second transistor being connected to the power source, a drain of the fourth transistor being connected to a fifth node,
    a drain and a gate of the fifth transistor being connected to the second switch circuit, and
    a source of the fifth transistor being connected to a power terminal.

19. The biasing apparatus of claim 17, further comprising a third storage device that is connected between a power terminal and a control terminal of the fifth transistor.

20. The biasing apparatus of claim 14, further comprising:
    an electronic apparatus control signal controlling an operation of the electronic apparatus; and
    a control circuit that controls the first and second bias control circuit portions of the bias control circuit based on the electronic apparatus control signal.

21. The biasing apparatus of claim 17, the control circuit comprising:
    a sixth transistor having a control terminal and two power terminals, the control terminal being connected to a feedback biasing voltage, and a first power terminal being connected to a control terminal that inputs an electronic apparatus control signal; and
    a resistor having a first terminal and a second terminal, the first terminal of the resistor being connected to the source of the fourth transistor, and the second terminal of the resistor being connected to the first power terminal of the sixth transistor.

22. The biasing apparatus of claim 21, wherein the sixth transistor regulates a current flowing through the second and fourth transistors to effect the biasing signal when the second switch circuit connects the first and second bias control circuit portions.

23. The biasing apparatus of claim 21, wherein the sixth transistor is a FET transistor.

24. The biasing apparatus of claim 13, further comprising:
a set-up time; and
a hold time, the set-up time being a time between a rising edge of the second clock to a rising edge of the first clock, and the hold time being a time between a falling edge of the first clock and a falling edge of the second clock.

25. The biasing apparatus of claim 13, wherein the first clock and the second clock have a same clock frequency, the clock frequency being filtered out by an operation of the electronic apparatus.

26. The biasing apparatus of claim 13, wherein the electronic apparatus is a voltage controlled oscillator.

27. A biasing apparatus biasing an electronic apparatus, comprising:
a biasing circuit that supplies a biasing current to the electronic apparatus based on a bias signal;
a capacitor coupled to the biasing circuit at a first node, the capacitor storing a first value that corresponds to the bias signal;
a bias control circuit that changes during biasing of the electronic apparatus between a normal power consumption mode and a reduced power consumption mode, the normal power consumption being greater than the reduced power consumption of the bias control circuit, the bias control circuit having a first bias control circuit portion and a second bias control circuit portion, the first bias control circuit portion providing the bias signal to a second node;
a first switch connected between the first node and the second node, the first switch being in an open state disconnecting the first and second nodes when the bias control circuit is in the reduced power consumption mode and in a closed state connecting the first and second nodes when the bias control circuit is in the normal power consumption mode;
a first clock that controls the first switch to be in the closed state when in a first active time period, and to be in the open state when in a first inactive time period;
a second switch and a third switch coupling the first bias control circuit portion to the second bias control circuit portion, the second and third switches being in a circuit state disconnecting the first bias control circuit portion from the second bias control circuit portion when the bias control circuit is in the reduced power consumption mode and in a closed state connecting the first bias control circuit portion to the second bias control circuit portion when the bias control circuit is in the normal power consumption mode; and
a second clock that controls the second and third switches to be in the closed state when in a second active time period and in the open state when in a second inactive time period, the second clock having a second active duty cycle being equal to or greater than a first active duty cycle.

28. The biasing apparatus of claim 27, further comprising:
a second bias signal storage circuit connected to the second node, the second bias signal storage circuit storing a first state corresponding to the bias signal;
a signal storage circuit that is connected between a power terminal and the second bias control circuit portion; and
a control circuit that controls the first and second bias control circuit portions of the bias control circuit based on an electronic circuit control signal.

29. A portable apparatus, comprising:
a controller; and
a communication circuit coupled to the controller that incorporates the biasing apparatus of claim 28.

30. The portable apparatus of claim 29, wherein the portable apparatus includes one of a cellular telephone, a personal digital assistant, a portable computer, a satellite, a media reader, and a communication unit disposed in a movable platform.

31. A method for biasing an electronic apparatus, comprising:
changing by a bias control circuit during biasing of the electronic apparatus between a normal power consumption mode in a normal power time period while generating a bias signal and a reduced power consumption mode in a reduced power time period while not generating the bias signal, the normal power consumption being greater than the reduced power consumption of the bias control circuit;
biasing the electronic apparatus by a biasing circuit based on the bias signal during both the normal power time period and the reduced power time period; and
coupling between the bias control circuit and the biasing circuit by a first switch circuit.

32. The method of claim 31, further comprising storing the bias signal as a stored bias signal at least during a portion of the reduced power time period; and
biasing the electronic apparatus using the stored bias signal during at least the reduced power time period.

33. The method of claim 32, further comprising:
setting a level of the stored bias signal during an active state of a first clock;
not setting the level of the stored bias signal during an inactive state of the first clock;
generating the bias signal during an active state of a second clock; and
not generating the bias signal during an inactive state of the second clock, the first and second clocks having a same frequency, the active state of the first clock occurring when the second clock is at an active state, and the second clock having an active duty cycle that is greater than an active duty cycle of the first clock.

34. The method of claim 33, further comprising:
electrically disconnecting a first portion and a second portion of a bias signal generator; and
outputting the bias signal from the first portion.

35. The method of claim 34, further comprising:
enabling the first portion to generate the bias signal by connecting the first portion to the second portion when the second clock is in the active state; and
disabling the first portion from generating the bias signal by disconnecting the first portion from the second portion.

36. The method of claim 35, further comprising:
holding a representative state of an output of the bias signal from the first portion when the first portion is disconnected from the second portion.

37. The method of claim 36, further comprising:
injecting an electronic circuit control signal in the second portion; and
combining the electronic circuit control signal with a biasing signal to generate the bias signal.

38. A method for making a biasing apparatus that biases an electronic apparatus, comprising:
- connecting a first transistor between a power source and the electronic apparatus that is a voltage controlled oscillator;
- connecting a control terminal of the first transistor directly to a first terminal of a first switch;
- connecting a storage device to the control terminal of the first transistor;
- connecting a control terminal of the first switch directly to a first control terminal;
- connecting a second terminal of the first switch directly to a control terminal of a second transistor and a control terminal of a third transistor; and
- connecting a first power terminal of the second transistor directly to the control terminal of the second transistor.

39. The method of claim 38, further comprising:
- connecting a first terminal of a second switch to the first power terminal of the second transistor;
- connecting a first terminal of a third switch to a first power terminal of the third transistor; and
- connecting control terminals of the second and third switches to a second control terminal.

40. The method of claim 39, further comprising:
- connecting a second terminal of the second switch to a first power terminal of a fourth transistor;
- connecting a second terminal of the third switch to a first power terminal of a fifth transistor;
- connecting the first power terminal of the fifth transistor to a control terminal of the fifth transistor; and
- connecting a control terminal of the fourth transistor to the control terminal of the fifth transistor.

41. The method of claim 40, further comprising:
- connecting a second power terminal of the fourth transistor to a first terminal of a resistor;
- connecting a second terminal of the resistor to a first power terminal of a sixth transistor; and
- connecting a control terminal of the sixth transistor to a third control terminal.

42. The method of claim 40, further comprising:
- connecting a capacitor to the control terminals of the second and third transistors; and
- connecting a capacitor to the first power terminal of the fifth transistor.

43. The method of claim 41, further comprising:
- connecting the first control terminal to a first clock source;
- connecting the second control terminal to a second clock source; and
- connecting the third control terminal to an electronic apparatus control signal source.

44. A biasing apparatus that biases an electronic apparatus, comprising:
- biasing current supply means for supplying current to bias the electronic apparatus; and
- bias control means for generating a bias signal in a normal power consumption mode and not generating the bias signal in a reduced power consumption mode of the bias control means, the biasing current supply means biasing the electronic apparatus based on the bias signal.

45. The apparatus of claim 44, further comprising:
- first switching means for connecting the bias control means to the biasing current supply means during at least a portion of a time period when the bias control means is in the normal power consumption mode, and disconnecting the bias control means from the biasing current supply means during at least a portion of a time period when the bias control means is in the reduced power consumption mode; and
- first clock means for controlling the first switching means to connect the biasing current supply means to the bias control means or to disconnect the biasing current supply means from the bias control means.

46. The apparatus of claim 45, further comprising bias signal storage means for storing a representative state of the bias signal when the first switching means is connecting the bias control means to the biasing current supply means, and for supplying a stored bias signal to the biasing current supply means during the time period when the bias control means is in the reduced power consumption mode.

47. The apparatus of claim 45, further comprising:
- second switching means coupled to the bias control means for setting the bias control means in the normal power consumption mode and the reduced power consumption mode with a first duty cycle; and
- second clock means for controlling the second switching means to set the bias control means in the normal power consumption mode or the reduced power consumption mode with a second duty cycle, the second duty cycle being greater that the first duty cycle, the first and second clock means having a frequency that may be filtered by an operation of the electronic apparatus.

48. The apparatus of claim 44, further comprising:
- injecting means for injecting an electronic apparatus control signal into the bias control means; and
- internal value storage means for storing an internal value of the bias control means.

49. The apparatus of claim 44, wherein the electronic apparatus is a voltage controlled oscillator.

50. A biasing apparatus, comprising:
- a biasing circuit coupled to a voltage-controlled oscillator and configured to provide a substantially uninterrupted bias current to the voltage-controlled oscillator while alternating between a normal-power operating mode and a reduced-power operating mode;
- a bias control circuit configured to provide the normal-power operating mode and the reduced-power operating mode; and
- a first switch circuit coupled between the bias control circuit and the biasing circuit.

51. The biasing apparatus of claim 50, wherein the biasing circuit includes a current controlling circuit configured to establish a level of a control bias current, and a current supplying circuit configured to provide the control bias current based on an intermittent control signal from the current controlling circuit.

52. The biasing apparatus of claim 50, wherein the biasing circuit includes a current supplying circuit with the current supplying circuit coupled to the voltage-controlled oscillator, and a current controlling circuit configured to cause the current supplying circuit to provide a bias current level to the voltage-controlled oscillator by use of a first control signal.

53. The biasing apparatus of claim 52, wherein the current supplying circuit includes a first transistor having a first upper power port coupled to a power supply, a first lower power port coupled to the voltage-controlled oscillator, and a first control port coupled to the current controlling circuit to receive the first control signal.

54. The biasing apparatus of claim 53, wherein the first transistor is a FET device.

55. The biasing apparatus of claim 52, wherein the current supplying circuit further includes a first storage circuit coupled to a first control port and configured to store the first control signal.

56. The biasing apparatus of claim 55, wherein the first storage circuit is a capacitive circuit capable of storing a charge representative of the first control signal.

57. The biasing apparatus of claim 52, wherein a first current control signal is provided from the current controlling circuit to the current supplying circuit via a first control line, and wherein the biasing apparatus further comprises a first switch in the first control line capable of connecting or disconnecting the current supplying circuit to/from the current controlling circuit.

58. The biasing apparatus of claim 57, wherein when the first switch disconnects the current supplying circuit from the current controlling circuit, a capacitive circuit stores a voltage charge representative of the first control signal.

59. The biasing apparatus of claim 58, wherein the current controlling circuit operates in the reduced-power operating mode for at least a majority of time while the first switch is open.

60. The biasing apparatus of claim 59, wherein the current controlling circuit operates in the normal-power operating mode for at least a majority of time while the first switch is closed.

61. The biasing apparatus of claim 52, wherein the current controlling circuit includes one or more second-stage switches configured to cause the current controlling circuit to consume a reduced amount of current.

62. The biasing apparatus of claim 61, wherein the current controlling circuit includes a first circuit portion between a power supply and the one or more second-stage switches, and a second circuit portion between a ground and the one or more second-stage switches.

63. The biasing apparatus of claim 61, wherein the current controlling circuit includes at least one charge-holding capacitor configured to maintain a gate bias of at least one MOSFET in order to decrease a time that the current controlling circuit transitions from the reduced-power operating mode to the normal-power operating mode.

64. A phase-lock loop incorporating the biasing apparatus of claim 50, wherein a first switch alternately opens and closes at a sufficiently low frequency such that low-frequency signals generated by the biasing apparatus are rejected by a high-frequency filter in the phase-lock loop.

* * * * *